(12) United States Patent
Yuan et al.

(10) Patent No.: US 9,647,618 B1
(45) Date of Patent: May 9, 2017

(54) SYSTEM AND METHOD FOR CONTROLLING COMMON MODE VOLTAGE VIA REPLICA CIRCUIT AND FEEDBACK CONTROL

(71) Applicant: QUALCOMM Incorporated, San Diego, CA (US)

(72) Inventors: Xiaobin Yuan, Cary, NC (US); Joseph Natonio, Wappingers Falls, NY (US); Mangal Prasad, Raleigh, NC (US); Todd Morgan Rasmus, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/084,910

(22) Filed: Mar. 30, 2016

(51) Int. Cl.
*H03F 3/45* (2006.01)
*H03G 3/00* (2006.01)

(52) U.S. Cl.
CPC ......... *H03F 3/45672* (2013.01); *H03G 3/004* (2013.01); *H03F 2200/456* (2013.01); *H03F 2200/555* (2013.01); *H03F 2203/45154* (2013.01); *H03F 2203/45156* (2013.01)

(58) Field of Classification Search
CPC ........................................................ H03F 3/45
USPC ........................................ 330/258, 261, 254
See application file for complete search history.

(56) References Cited

U.S. PATENT DOCUMENTS

| 5,386,207 | A | * | 1/1995 | Lin | ...................... | H03F 3/45183 327/513 |
| 6,429,700 | B1 | | 8/2002 | Yang | | |
| 6,504,403 | B2 | * | 1/2003 | Bangs | ................. | H03F 3/45085 327/62 |
| 6,559,720 | B1 | * | 5/2003 | Huijsing | ............ | H03F 3/45197 330/253 |
| 7,268,624 | B2 | * | 9/2007 | Chen | ................... | H03F 3/45197 330/2 |
| 7,358,805 | B2 | | 4/2008 | Shia et al. | | |
| 7,834,696 | B2 | * | 11/2010 | Giotta | ................ | H03F 3/45179 330/258 |

(Continued)

OTHER PUBLICATIONS

Kimura H., et al., "A 28 Gb/s 560 mW Multi-Standard SerDes With Single-Stage Analog Front-End and 14-Tap Decision Feedback Equalizer in 28 nm CMOS," IEEE Journal of Solid-state Circuits, Dec. 2014, vol. 49, No. 12, pp. 3091-3103.

*Primary Examiner* — Henry Choe
(74) *Attorney, Agent, or Firm* — Loza & Loza LLP

(57) ABSTRACT

The disclosure relates to a system and method for controlling a common mode voltage of an output differential signal of a differential signal processing circuit using a replica circuit and feedback control. The differential signal processing circuit includes two load devices, two input transistors, and two current-source transistors coupled in series between voltage rails, respectively. The replica circuit includes replica load device, replica input transistor, and replica current-source transistor coupled in series between the voltage rails. The common mode voltage of the input differential signal is applied to the replica input transistor to generate a replica output common mode voltage. A feedback circuit generates a bias voltage for the replica current-source transistor and the current-source transistors of the differential circuit to set and control the replica output common mode voltage and the output common mode voltage of the differential signal processing circuit to a target common mode voltage.

30 Claims, 11 Drawing Sheets

(56) References Cited

U.S. PATENT DOCUMENTS

| | | |
|---|---|---|
| 8,121,160 B2 * | 2/2012 | Moto .................. H01S 5/042 330/127 |
| 8,552,801 B2 | 10/2013 | Myles |
| 9,231,731 B1 | 1/2016 | Nguyen et al. |
| 9,240,912 B1 | 1/2016 | Giridharan et al. |
| 2004/0021519 A1 * | 2/2004 | Casper ............... H03F 3/45183 330/253 |
| 2009/0251227 A1 | 10/2009 | Jasa |

* cited by examiner

SYSTEM AND METHOD FOR CONTROLLING COMMON MODE VOLTAGE VIA REPLICA CIRCUIT AND FEEDBACK CONTROL

BACKGROUND

Field

Aspects of the present disclosure relate generally to common mode voltage control, and in particular, to a system and method for controlling common mode voltage of an output differential signal of a differential signal processing circuit using a replica circuit and feedback control.

Background

Differential signal processing circuits, such as variable gain amplifiers (VGAs) and continuous time linear equalizers (CTLEs), receive and apply a particular frequency-dependent gain to an input differential signal to generate an output differential signal. The input differential signal is typically received at control terminals (e.g., gates) of input transistors (e.g., field effect transistors (FETs)), and the output differential signal are generated at other terminals (e.g., drains) of the input transistors.

The effective direct current (DC) voltage level of a differential signal is generally referred to as the common mode voltage. The common mode voltage is generally the average voltage between the voltage levels of the positive and negative components of the differential signal. The common mode voltage affects the operating point of the devices to which the differential signal is applied. If the common mode voltage varies, the operating point of the devices varies, which may have undesirable consequences.

In the context of a differential signal processing circuit, the input differential signal applied to the input transistors may have a common mode voltage that varies for a number of reasons. The gain applied to the input differential signal by the differential signal processing circuit results in an output differential signal that has a common mode voltage that varies with the common mode voltage of the input differential signal. In addition, process variation of the differential signal processing circuit itself creates significant common mode voltage variation. As a result, the input transistors are subjected to varying common mode voltage levels, which has the adverse consequence of reducing gain and peaking control for the differential signal processing circuit. Additionally, the varying common mode voltage of the output differential signal may adversely affect the operation of one or more devices downstream of the differential signal processing circuit.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus for generating a first output differential signal having a controlled common mode voltage. The apparatus includes a first differential signal processing circuit configured to generate a first output differential signal based on an input differential signal. The first differential signal processing circuit includes first and second load devices; first and second input transistors including first and second control terminals configured to receive first and second components of the input differential signal, respectively; first and second current-source transistors coupled in series with the first and second load devices and the first and second input transistors between a first voltage rail and a second voltage rail, respectively; wherein first and second components of the first output differential signal are configured to be generated at first and second nodes between the first and second load devices and the first and second input transistors, respectively. The apparatus further includes a first control circuit configured to control a first output common mode voltage of the first output differential signal by generating a first bias voltage for control terminals of the first and second current-source transistors from an input common mode voltage of the input differential signal.

Another aspect of the disclosure relates to a method for generating a first output differential signal having a controlled common mode voltage. The method includes applying first and second components of an input differential signal to first and second control terminals of first and second input transistors of a first differential signal processing circuit, respectively; generating first and second components of a first output differential signal at first and second nodes between first and second load devices and the first and second input transistors, respectively; and controlling a first common mode voltage of the first output differential signal including generating a first bias voltage for control terminals of first and second current-source transistors coupled in series with the first and second load devices and the first and second input transistors between first and second voltage rails, respectively, wherein the first bias voltage is generated from an input common mode voltage of the input differential signal.

Another aspect of the disclosure relates to an apparatus for generating a first output differential signal having a controlled common mode voltage. The apparatus includes means for applying first and second components of an input differential signal to first and second control terminals of first and second input transistors of a first differential signal processing circuit, respectively; means for generating first and second components of a first output differential signal at first and second nodes between first and second load devices and the first and second input transistors, respectively; and means for controlling a first common mode voltage of the first output differential signal including generating a first bias voltage for control terminals of first and second current-source transistors coupled in series with the first and second load devices and the first and second input transistors between first and second voltage rails, respectively, wherein the first bias voltage is generated from an input common mode voltage of the input differential signal.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

For differential signal processing circuits, such as voltage gain amplifiers (VGAs) and continuous time linear equalizers (CTLEs), control of the common mode voltage (effective direct current (DC) voltage level) at the outputs of these circuits is desirable to achieve tight gain and peaking control for the circuits, and to provide proper common mode voltage levels for other downstream circuits. However, the common mode voltage of an input differential signal to these circuits may be subject to variation. In addition, process variation of the devices in the VGA and CTLE create significant common mode voltage variation. If not compensated, the varying common mode voltage and the process variation affect the common mode voltage of the output differential signal, which may result in reduced gain and peaking control for the differential signal processing circuits.

Figure 1:
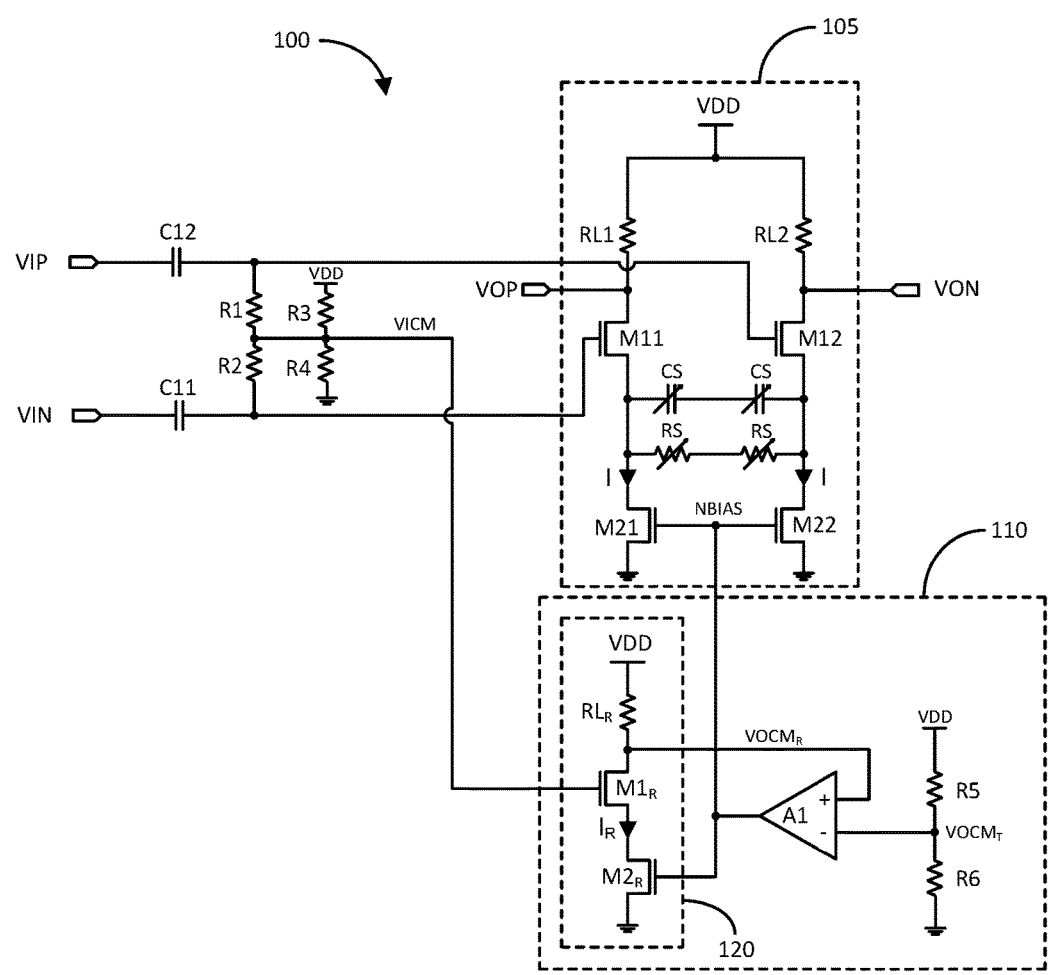
FIG. 1 illustrates a schematic diagram of an exemplary receiver including a variable gain amplifier (VGA) with a common mode voltage control circuit in accordance with an aspect of the disclosure.

FIG. 1 illustrates a schematic diagram of an exemplary receiver 100 including a variable gain amplifier (VGA) 105 in accordance with an aspect of the disclosure. The VGA 105 is an example of a differential signal processing circuit. In particular, the VGA 105 is configured to amplify an input differential signal (VIP and VIN) with a certain gain-frequency response to generate an output differential signal (VOP and VON).

As indicated, the gain of the VGA 105 may be configured to be frequency dependent, whereby, in this example, the gain may be substantially flat over a particular lower frequency range and peaks over a particular higher frequency range. The receiver 100 including the VGA 105 may be employed at a front-end of an integrated circuit (IC) to receive and amplify the input differential signal to compensate for high frequency attenuation due to propagation via a transmission medium.

As discussed in more detail herein, the receiver 100 includes a control circuit 110 configured to control a common mode voltage of the output differential signal (VOP and VON). In summary, the control circuit 110 generates a bias voltage NBIAS applied to control terminals of current-source transistors for controlling the currents I through these transistors. The common mode voltage of the output differential signal (VOP and VON) is a function of the current I through these transistors. For example, the output common mode voltage VOCM may be approximated as:

$$VOCM = VDD - I*RL$$

Where VDD is the supply voltage at a first voltage rail, I is the current through each of the current-source transistors, and RL is the resistance of each of the load devices, as discussed in more detail below. The control circuit 110 uses a replica circuit configured similar to one side of the VGA 105 for generating the bias voltage NBIAS based on a common mode voltage of the input differential signal (VIP and VIN).

In particular, the VGA 105 includes a first load device RL1 (e.g., a resistor), a first input transistor M11 (e.g., an n-channel metal oxide semiconductor (NMOS) field effect transistor (FET) (referred to herein as "NMOS")), and a first current-source transistor M21 (e.g., an NMOS) coupled in series between a first voltage rail (VDD) and a second voltage rail (VSS) (e.g., ground). The VGA 105 further includes a second load device RL2 (e.g., a resistor), a second input transistor M12 (e.g., an NMOS), and a second current-source transistor M22 (e.g., an NMOS) coupled in series between the first voltage rail (VDD) and the second voltage rail (VSS).

For gain and frequency response adjustment, the VGA 105 includes one or more variable capacitors CS coupled in series between the respective lower terminals (e.g., sources) of the input transistors M11 and M12, and one or more variable resistors RS coupled in series between the respective lower terminals (e.g., sources) of the input transistors M11 and M12. In general, the one or more resistors RS set the low frequency gain for the VGA 105 and the one or more capacitors CS provide gain peaking at higher frequency in order to compensate for high frequency attenuation of the input differential signal (VIP and VIN) as a result of propagating via a transmission medium.

As indicated, the input differential signal includes a positive component VIP and a negative component VIN, which are applied to the control terminals (e.g., gates) of the input transistors M12 and M11 via alternating current (AC)-coupling capacitors C12 and C11, respectively. The VGA 105 generates an output differential signal including positive and negative components VOP and VON at nodes between the first and second load devices RL1 and RL2 and the input transistors M11 and M12, respectively.

The control terminals (e.g., gates) of the current-source transistors M21 and M22 are coupled together, and configured to receive a bias voltage NBIAS for setting the current I through each of the transistors M21 and M22. The control circuit 110 is configured to generate the bias voltage NBIAS to set and control (e.g., regulate) the common mode voltage VOCM of the output differential signal VOP and VON, as discussed further herein.

The control circuit 110 includes a replica circuit 120 having a replica load device $RL_R$ (e.g., a resistor), a replica input transistor $M1_R$ (e.g., an NMOS), and a replica current-source transistor $M2_R$ (e.g., an NMOS) coupled in series between the first voltage rail (VDD) and the second voltage rail (VSS). The replica load resistor $RL_R$, replica input transistor $M1_R$, and replica current-source transistor $M2_R$ may be replicated substantially the same as or scaled versions of the load device RL1 or RL2, input transistor M11 or M12, and current-source transistor M21 or M22, respectively. Accordingly, the replica circuit 120 is configured similar to one side of the VGA 105.

More specifically, the replica circuit 120 may be configured to generate a replica current $I_R$ being substantially the same or a scaled version of the current I through the current-source transistor M11 or M12. For reduced power consumption purposes, the replica current $I_R$ may be proportional to the current I by a defined ratio R being less than one (1) (e.g., R=1/10, where $I_R$=R*I). To effectuate this ratio R, the replica load device $RL_R$ may be configured to have a resistance $R_R$ proportional to the resistance RL of each of the first or second load device $RL_1$ or $RL_2$ (e.g., $R_R$=1/R*RL). Further, the input replica transistor $M1_R$ may be configured to have a channel width $W_{R1}$ that is proportional to the channel width $W_1$ of each of the input transistor M11 or M12 by the defined ratio R (e.g., $W_{R1}$=R*$W_1$). Similarly, the replica current-source transistor $M2_R$ may be configured to have a channel width $W_{R2}$ that is proportional to the channel width $W_2$ of each of the current-source transistor M21 or M22 by the defined ratio R (e.g., $W_{R2}$=R*$W_2$).

The common mode voltage VICM of the input differential signal VIP and VIN is taken off a node between resistors R1 and R2 coupled in series between the control terminals (e.g., gates) of the inputs transistors M12 and M11, respectively. The resistors R1 and R2 may serve as a termination impedance (e.g., 50Ω) for the input of the VGA 105. To adjust the input common mode voltage VICM of the input differential signal to be closer to a desired value, another pair of resistors R3 and R4 may be coupled in series between the first voltage rail (VDD) and the second voltage rail (VSS), where the node between the resistors R3 and R4 is coupled to the node between resistors R1 and R2.

The common mode voltage VICM of the input differential signal VIP and VIN is applied to the control terminal (e.g., gate) of the replica input transistor $M1_R$. This replicates the input differential signal VIP and VIN being applied to the control terminals (e.g., gates) of the input transistors M12 and M11 of the VGA 105. As the output differential signal VOP and VON is generated at the upper terminals (e.g., drains) of input transistors M11 and M12, a replica output common mode voltage $VOCM_R$ is generated at the corresponding upper terminal (e.g., drain) of the replica input transistor $M1_R$. The replica circuit 120 being a replica or scaled version of one side of the VGA 105 (and having the same bias voltage NBIAS applied to the corresponding current-source transistor, as discussed below) results in the replica output common mode voltage $VOCM_R$ being substantially the same as the common mode voltage VOCM of the output differential signal VOP and VON.

The control circuit 110 further includes a voltage divider having resistors R5 and R6 coupled in series between the first voltage rail (VDD) and the second voltage rail (VSS). The respective resistances of the resistors R5 and R6 are configured to set a target output common mode voltage $VOCM_T$ for the output differential signal VOP and VON of the VGA 105.

Additionally, the control circuit 110 includes a differential (operational) amplifier A1 having a first input (e.g., negative) configured to receive the target output common mode voltage $VOCM_T$. The differential amplifier A1 includes a second input (e.g., positive) configured to receive the replica output common mode voltage $VOCM_R$ generated at the upper terminal (e.g., drain) of the replica input transistor $M1_R$. The differential amplifier A1 includes an output coupled to the control terminals (e.g., gates) of the current-source transistors M21 and M22, and to the control terminal (e.g., gate) of the replica current-source transistor $M2_R$.

Thus, by feedback control, the differential amplifier A1 generates the bias voltage NBIAS to cause the replica output common mode voltage $VOCM_R$ to be substantially the same as the target common mode voltage $VOCM_T$. Since the replica output common mode voltage $VOCM_R$ is substantially the same as the common mode voltage VOCM of the output differential signal VOP and VON of the VGA 105, the bias voltage NBIAS causes (e.g., controls or regulates) the common mode voltage VOCM of the output differential signal to be substantially the same as the target common mode voltage $VOCM_T$.

Accordingly, since the common mode voltage VOCM of the output differential signal VOP and VON of the VGA 105 is controlled or regulated (e.g., substantially constant), the upper terminals (e.g., drains) of the input transistors M1l and M12 operate around a substantially constant and desired effective DC voltage level. This results in the VGA 105 exhibiting tight gain and peaking control. The controlled output common mode voltage VOCM of the output differential signal VOP and VON may also provide appropriate input signal levels for one or more downstream stages.

The technique of using the common mode voltage control circuit 110 may be applied to other types of differential signal processing circuits, such as continuous time linear equalizers (CTLEs), as discussed as follows.

Figure 2:
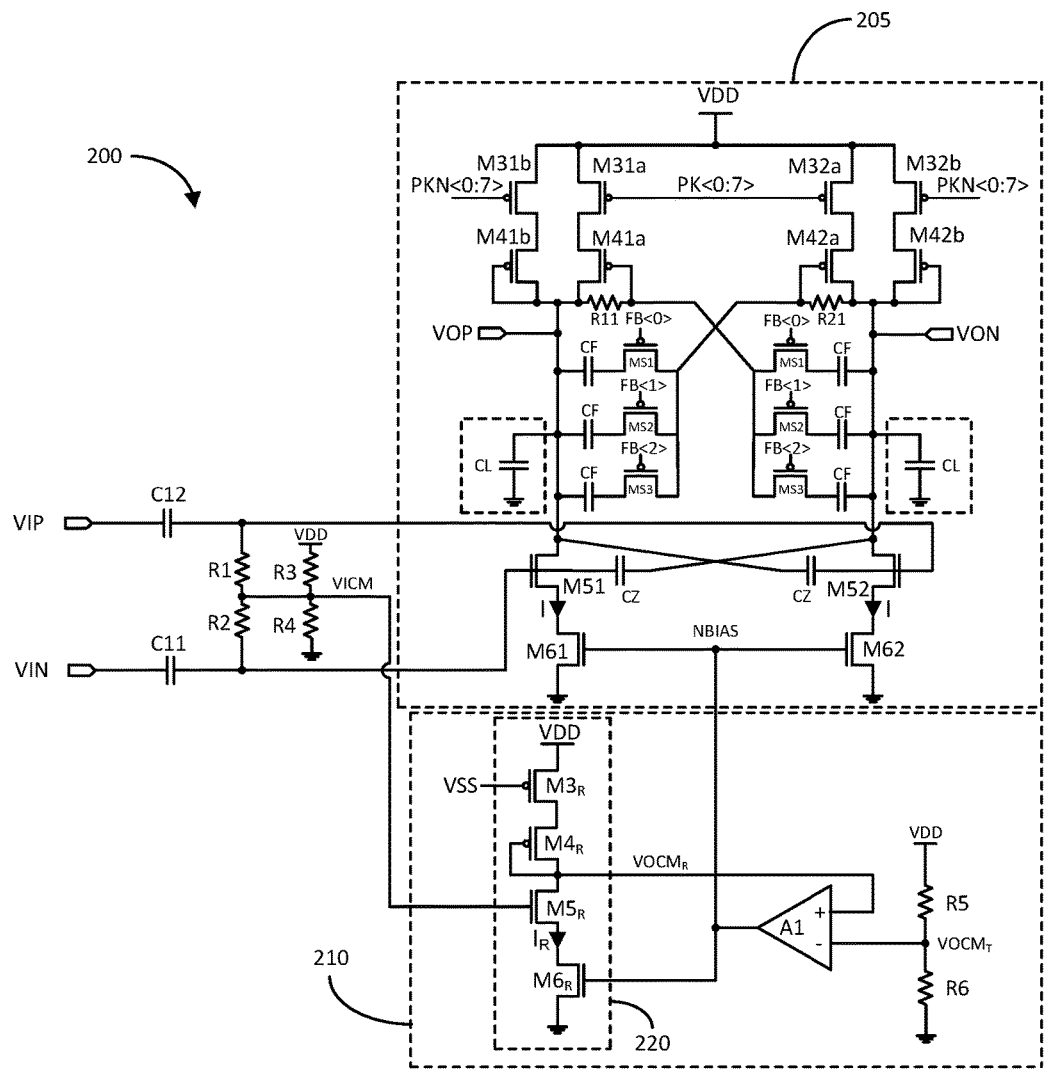
FIG. 2 illustrates a schematic diagram of an exemplary receiver including a continuous time linear equalizer (CTLE) with a common mode voltage control circuit in accordance with another aspect of the disclosure.

FIG. 2 illustrates a schematic diagram of an exemplary receiver 200 including a continuous time linear equalizer (CTLE) 205 with a common mode voltage control circuit 210 in accordance with another aspect of the disclosure. The CTLE 205 is another example of a differential signal processing circuit. Thus, it shall be understood that in addition to the VGA 105 and the CTLE 205, the common mode control circuits described herein may be applied to other types of differential signal processing circuit.

Similar to the VGA 105, the CTLE 205 is configured to receive an input differential signal (VIP and VIN) and perform more extensive programmable equalization of the input differential signal to generate an output differential signal (VOP and VON). The control circuit 210 is similar to that of control circuit 110, except that it includes a replica circuit 220 that is different because the CTLE 205 is different than the VGA 105. In other words, the replica circuit 220 replicates the elements of the CTLE 205, whereas the replica circuit 110 replicates the elements of the VGA 105.

In particular, the CTLE 205 includes positive-side sets of selectable parallel active load devices M31a, M31b, M41a, and M41b (transistors). For simplicity purposes, only one set (M31a, M31b, M41a, and M41b) is shown. As shown, the devices are configured as p-channel metal oxide semiconductor (PMOS) FETs (referred to herein as "PMOS"). The upper transistors M31a and M32b operate as switches to effectively place a selected one of the lower transistors M41a and M41b as a load device for the CTLE 205. The transistors M31a and M41a are coupled in series between the first voltage rail (VDD) and the drain of input transistor M51. Similarly, the transistors M31b and M41b are coupled in series between the first voltage rail (VDD) and the drain of input transistor M51. The transistor M41a is diode-connected with a resistor R11 coupled between its gate and drain. The transistor M41b is diode-connected without a resistor.

One bit of a select signal PK<0:7> is applied to the gate of transistor M31a and a corresponding bit of a complementary select signal PKN<0:7> is applied to the gate of transistor M31b. If the bit applied to the gate of transistor M31a is asserted (e.g., at VSS) and the bit applied to gate of transistor M31b is not asserted (e.g., at VDD), transistor M31a is turned on and transistor M31b is turned off. Accordingly, VDD is applied to transistor M41a via the turned-on transistor M31a, thereby configuring the diode-connected transistor M41a as a load to the positive-side of the CTLE 205; and VDD is not applied to transistor M41b due to the turned-off transistor M31b, thereby not configuring the diode-connected transistor M41b as a load to the positive-side of the CTLE 205. Similarly, if the bit applied to the gate of transistor M31a is not asserted (e.g., at VDD) and the bit applied to the gate of transistor M31b is asserted (e.g., at VSS), then, as above, the diode-connected transistor M41b is configured as a load device and the diode-connected transistor M41a is not configured as a load device for the positive-side of the CTLE 205.

At lower frequencies, the impedances of the diode-connected transistors M41a and M41b (with resistor R11) are approximately the same. Thus, for lower frequencies, configuring either one of the diode-connected transistors M41a and M41b as a load by turning a corresponding one of the switch transistors M31a and M31b does not significantly affect the gain of the CTLE 205. However, at higher frequencies, the impedance of the diode-connector transistor M41a is higher than the impedance of diode-connected transistor M41b due to the resistor R11. Accordingly, configuring transistor M41a as a load device by turning on transistor M31a (and not configuring transistor M41b as a load device by turning off transistor M31b), produces a higher gain or peaking for the CTLE 205, as compared to configuring transistor M41b as a load device by turning on transistor M31b (and not configuring transistor M41a as a load device by turning off transistor M31a). Since, in this example, there are eight (8) sets of parallel active load devices, the CTLE 205 may be tuned for a desired high frequency peaking via control signals PK<0:7> and PKN<0:7>.

Similarly, the CTLE 205 includes negative-side sets of selectable parallel active load devices M32a, M32b, M42a, and M42b (e.g., PMOS transistors). For simplicity purposes, only one set (M32a, M32b, M42a, and M42b) is shown. Each set of selectable active load devices M32a, M32b, M42a (with resistor R21), and M42b are coupled between the first voltage rail (VDD) and the drain of input transistor M52, and may be configured substantially the same and operate in substantially the same manner (via the signals PK<0:7> and PKN<0:7>) as the set of load devices M31a, M31b, M41a (with resistor R11), and M41b of the positive-side, such that the positive-side and the negative-side of the CTLE 205 are configured with substantially the same load impedance.

The CTLE 205 includes an input transistor M51 (e.g., an NMOS) and a current-source transistor M61 (e.g., an NMOS) coupled in series between the positive-side sets of selectable active load devices (collectively referred to as M41a and M41b) and a second voltage rail (VSS) (e.g., ground). Similarly, the CTLE 205 includes another input transistor M52 (e.g., an NMOS) and another current-source transistor M62 (e.g., an NMOS) coupled in series between the negative-side sets of active load devices (collectively referred to as M42a and M42b) and the second voltage rail (VSS).

The CTLE 205 includes additional circuitry for setting the gain-frequency response (e.g., with a high frequency resonance) of the CTLE, which includes selectable switches MS1-MS3 (e.g., PMOS transistors) via corresponding select signals FB<0:2>, and corresponding capacitors CF for both the positive- and negative-sides of the CTLE. Additionally, the CTLE 205 may include neutralizing capacitors CZ cross-coupled between the upper terminals (e.g., drains) and control terminal (e.g., gates) of input transistors M51 and M52, respectively. The neutralizing capacitors CZ serve to improve the input impedance matching of the CTLE 205 to reduce reflections of the input differential signal off the control terminals (e.g., gates) of the input transistors M51 and M52, and to also reduce noise.

An input differential signal including positive and negative components VIP and VIN are applied to the control terminals (e.g., gates) of the input transistors M52 and M51 via AC-coupling capacitors C12 and C11, respectively. The CTLE 205 is configured to generate an output differential signal including positive and negative components VOP and VON at the upper terminals (e.g., drains) of the input transistors M51 and M52, respectively. The outputs (e.g., at drains of input transistors M51 and M52) may be coupled to a downstream device, such as a sampler/slicer. The capacitors CL shown in respective dashed boxes represent the load capacitances coupled to the outputs of the CTLE 205, which may include the input capacitances of the downstream device. The control terminals (e.g., gates) of the current-source transistors M61 and M62 are coupled together, and configured to receive a bias voltage NBIAS generated by the common mode voltage control circuit 210.

The control circuit 210 includes a replica circuit 220, a differential (operational) amplifier A1, and a voltage divider including resistors R5 and R6 coupled in series between the first voltage rail (VDD) and the second voltage rail (VSS). The respective resistances of the resistors R5 and R6 are configured to generate a target output common mode voltage $VOCM_T$ for the output differential signal VOP and VON of the CTLE 205 at the node between the resistors R5 and R6.

The replica circuit 220 replicates an identical or scaled version of one side of the CTLE 205. For instance, the replica circuit 220 includes a replica switch device $M3_R$ (e.g., PMOS), a replica load (diode-connected) transistor $M4_R$ (e.g., PMOS), a replica input transistor $M5_R$ (e.g., NMOS), and a replica current-source transistor $M6_R$ (e.g., NMOS) coupled in series between the first voltage rail (VDD) and the second voltage rail (VSS). The replica devices $M3_R$, $M4_R$, $M5_R$, and $M6_R$ may be substantially the same or scaled versions of one switch device M31a, M31b, M32a, or M32b, one load (diode-connected) transistor M41b or M42b, one input transistor M51 or M52, and one current-source transistor M61 or M62, respectively.

More specifically, the replica circuit 220 may be configured to generate a replica current $I_R$ being substantially the same or a scaled version of the current I through the current-source transistor M61 or M62. For reduced power consumption purposes, the replica current $I_R$ may be proportional to the current I by a defined ratio R being less than one (1) (e.g., R=1/10, where $I_R$=R*I). To effectuate this ratio R, the replica load device $M3_R$ may be configured to have a channel width $W_{R3}$ that is proportional to the channel width $W_3$ of one switch device M31a, M31b, M32a, or M32b by the defined ratio R (e.g., $W_{R3}$=R*$W_3$). Similarly, the replica load (diode-connected) transistor $M4_R$ may be configured to have a channel width $W_{R4}$ that is proportional to the channel width $W_4$ of one diode-connected transistor M41b or M42b by the defined ratio R (e.g., $W_{R4}$=R*$W_4$). Further, the input replica transistor $M5_R$ may be configured to have a channel width $W_{R5}$ that is proportional to the channel width $W_5$ of one input transistor M51 or M52 by the defined ratio R (e.g., $W_{R5}$=R*$W_5$). Similarly, the replica current-source transistor $M6_R$ may be configured to have a channel width $W_{R6}$ that is proportional to the channel width $W_6$ of one current-source transistor M61 or M62 by the defined ratio R (e.g., $W_{R6}$=R*$W_6$).

Similarly, the input to the CTLE 205 includes a set of resistors R1-R4 configured to generate a common mode voltage VICM of the input differential signal VIP and VIN. The input common mode voltage VICM is applied to the replica input transistor $M5_R$. A voltage VSS, being substantially the same as the voltage at the first voltage rail (VSS), is applied to the control terminal (e.g., gate) of the replica switch device $M3_R$ to replicate the turning on of at least one of the switch device M31a, M31b, M32a, or M32b. The replica circuit 220 being a replica or scaled version of one side of the CTLE 205 (and having the same bias voltage NBIAS applied to the corresponding current-source transistor, as discussed below) results in the replica output common mode voltage $VOCM_R$ at the upper terminal (e.g., drain) of the replica input transistor $M5_R$ being substantially the same as the common mode voltage VOCM of the output differential signal VOP and VON.

The differential amplifier A1 includes a first (e.g., negative) input configured to receive the target common mode voltage $VOCM_T$ for the CTLE 205, a second (e.g., positive) input configured to receive the replica output common mode voltage $VOCM_R$, and an output coupled to the control terminals (e.g., gates) of the current-source transistors M61 and M62 of the CTLE 205, and to the control terminal (e.g., gate) of the replica current-source transistor $M6_R$.

Through feedback control, the differential amplifier A1 generates the bias voltage NBIAS to cause the replica output common mode voltage $VOCM_R$ to be substantially the same as the target common mode voltage $VOCM_T$. Since the replica output common mode voltage $VOCM_R$ is substantially the same as the common mode voltage VOCM of the output differential signal VOP and VON of the CTLE 205, the common mode voltage VOCM of the output differential signal is controlled to be substantially the same as the target common mode voltage $VOCM_T$. Again, this ensures tight gain and peaking control for the CTLE 205, and provides an appropriate common mode voltage level for one or more downstream stages.

Figure 3:
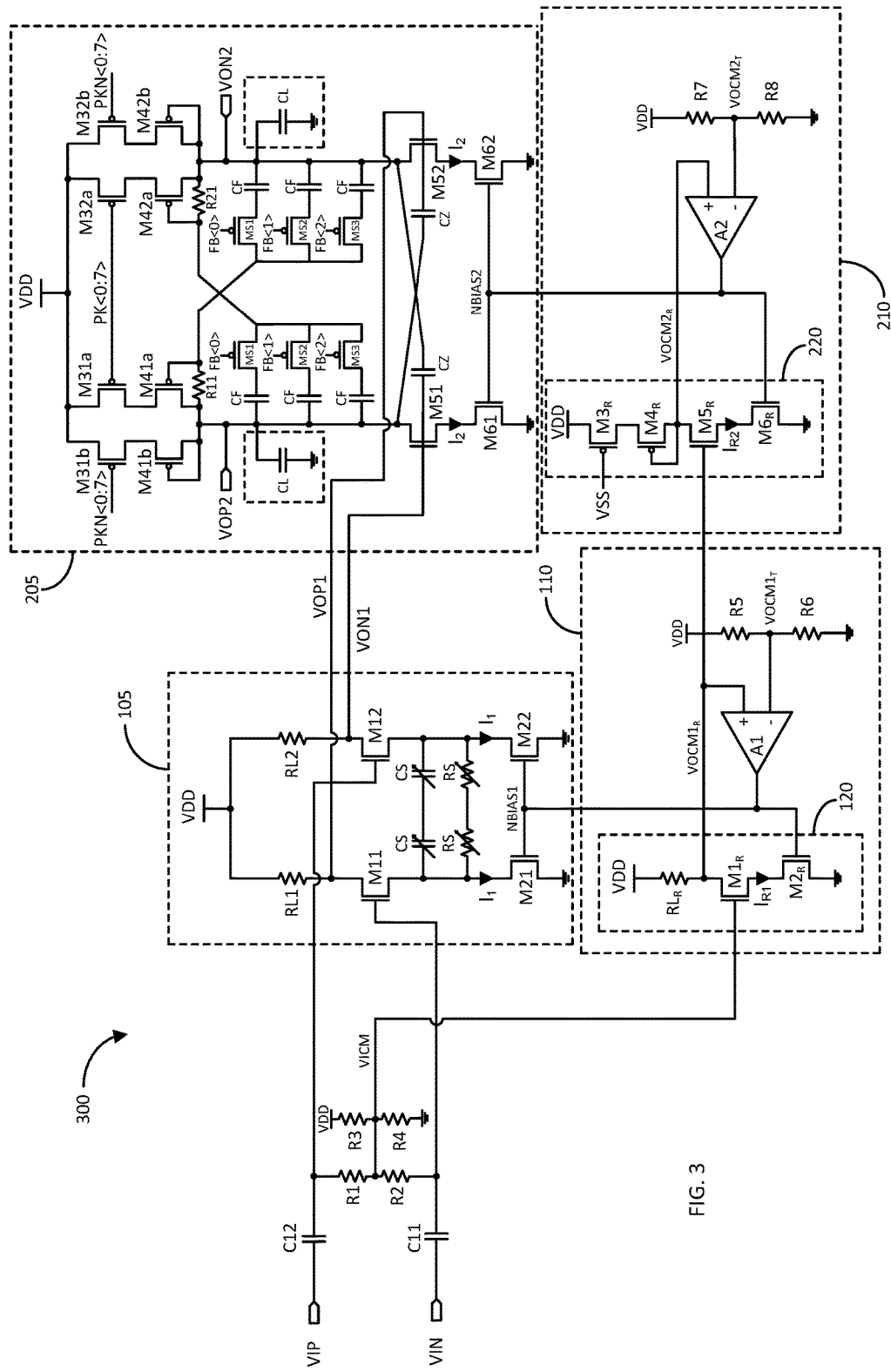
FIG. 3 illustrates a schematic diagram of an exemplary receiver including a VGA cascaded with a CTLE in accordance with another aspect of the disclosure.

FIG. 3 illustrates a schematic diagram of an exemplary receiver 300 including the VGA 105 cascaded with the CTLE 205 in accordance with another aspect of the disclosure. The receiver 300 includes the VGA common mode voltage control circuit 110 slightly modified to effectuate the cascading of the VGA 105 with the CTLE 205. Similarly, the receiver 300 includes the CTLE common mode voltage control circuit 210 slightly modified also to effectuate the cascading of the VGA 105 with the CTLE 205.

In particular, the VGA 105 is configured to generate a first output differential signal VOP1 and VON1 by applying a frequency-dependent gain to the input differential signal VIP and VIN. The positive component VOP1 and negative component VON1 of the first output differential signal are applied to the control terminals (e.g., gates) of the input transistors M52 and M51 of the CTLE 205, respectively.

As in receiver 100, the common mode voltage VICM of the input differential signal VIP and VIN is applied to the control terminal (e.g., gate) of the replica input transistor $M1_R$ of the replica circuit 120 of the VGA common mode voltage control circuit 110. The differential amplifier A1 generates a bias voltage NBIAS1 applied to the control terminal (e.g., gate) of replica current-source transistor $M2_R$ of the replica circuit 120 and the control terminals (e.g., gates) of current-source transistors M21 and M22 of the VGA 105. The differential amplifier A1 includes a first input (e.g., positive) configured to receive a first replica output common mode voltage $VOCM1_R$ from the upper terminal (e.g., drain) of the replica input transistor $M1_R$. The differential amplifier A1 includes a second input (e.g., negative) configured to receive a first target output common mode voltage $VOCM1_T$ from voltage divider R5/R6.

The differential amplifier A1 controls a replica current $I_{R1}$ flowing through the replica load device $RL_R$, replica input transistor $M1_R$, and replica current-source transistor $M2_R$ via the bias voltage NBIAS1 to cause the first replica common mode voltage $VOCM1_R$ to be substantially the same as the first target output common mode voltage $VOCM1_T$. By virtue of the fact that the replica circuit 120 is identical or a scaled version of one side of the VGA 105, the current $I_1$ through the current-source transistors M21 and M22 is substantially the same or a multiplication factor greater than the replica current $I_{R1}$. As such, the first replica output common mode voltage $VOCM1_R$ is substantially the same as the first common mode voltage VOCM1 of the first output differential signal VOP1 and VON1. Since $VOCM1_R$ is substantially the same as $VOCM1_T$, the control circuit 110 controls the first common mode voltage VOCM1 of the first differential output signal VOP1 and VON1 to be substantially the same as the first target output common mode voltage $VOCM1_T$.

The CTLE 205 is configured to generate a second output differential signal VOP2 and VON2 by applying a frequency-dependent gain to the first output differential signal VOP1 and VON1 from the VGA 105. Although not shown, the second output differential signal VOP2 and VON2 may be applied to a sampler/slicer for converting the second output differential signal into a digital signal for further processing downstream.

As the first output differential signal VOP1 and VON1 of the VGA 105 is applied to the input of the CTLE 205, the first replica common mode voltage $VOCM1_R$ is applied to the control terminal (e.g., gate) of the replica input transistor M5R of the replica circuit 220 of the CTLE common mode control circuit 210. Similarly, the control circuit 210 includes a differential amplifier A2 that generates a bias voltage NBIAS2 applied to the control terminal (e.g., gate) of replica current-source transistor $M6_R$ of the replica circuit 220 and the control terminals (e.g., gates) of current-source transistors M61 and M62 of the CTLE 205. The differential amplifier A2 includes a first input (e.g., positive) configured to receive a second replica output common mode voltage $VOCM2_R$ from the upper terminal (e.g., drain) of the replica input transistor M5$_R$. The differential amplifier A2 includes a second input (e.g., negative) configured to receive a second target output common mode voltage VOCM2$_T$ from a voltage divider R7/R8.

Through feedback control, the differential amplifier A2 controls a replica current I$_{R2}$ flowing through the replica switch device M3$_R$, replica load (diode-connected) transistor M4$_R$, replica input transistor M5$_R$, and replica current-source transistor M6$_R$ via the bias voltage NBIAS2 to cause the second replica common mode voltage VOCM2$_R$ to be substantially the same as the second target output common mode voltage VOCM2$_T$. By virtue of the fact that the replica circuit 220 is identical to or a scaled version of one side of the CTLE 205, the current I$_2$ through the current-source transistors M61 and M62 is substantially the same as or a multiplication factor greater than the replica current I$_{R2}$. As such, the second replica output common mode voltage VOCM2$_R$ is substantially the same as the common mode voltage VOCM2 of the second output differential signal VOP2 and VON2. Since VOCM2$_R$ is substantially the same as VOCM2$_T$, the control circuit 210 controls the common mode voltage VOCM2 of the second differential output signal VOP2 and VON2 to be substantially the same as the second target output common mode voltage VOCM2$_T$.

Figure 4:
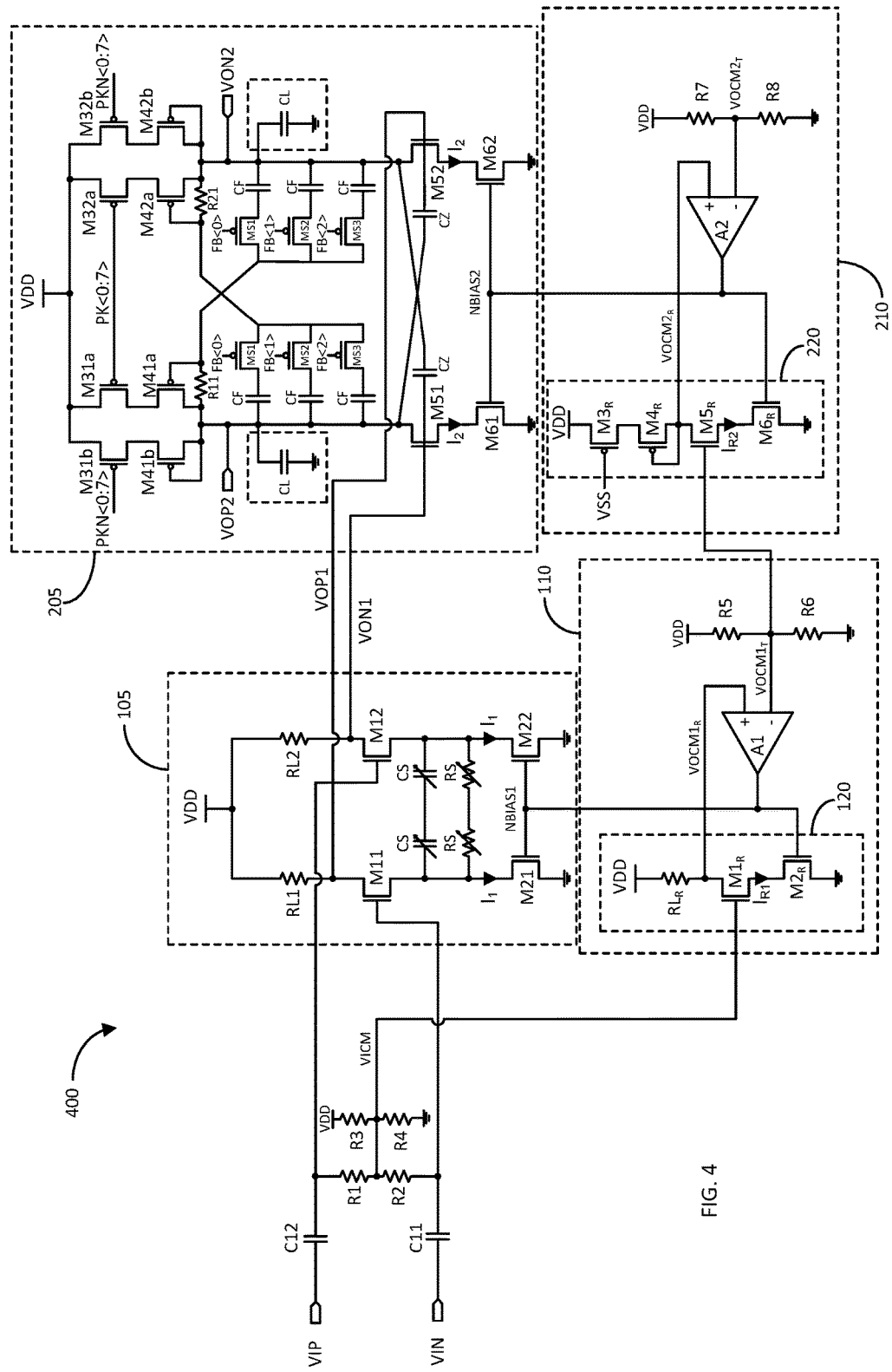
FIG. 4 illustrates a schematic diagram of another exemplary receiver including a VGA cascaded with a CTLE in accordance with another aspect of the disclosure.

FIG. 4 illustrates a block diagram of another exemplary receiver 400 including the VGA 105 cascaded with the CTLE 205 in accordance with another aspect of the disclosure. The receiver 400 is a variation of receiver 300. A difference between receiver 400 and receiver 300 is that the first target common mode voltage VOCM1$_T$ (and not the first replica common mode voltage VOCM1$_R$) is applied to the control input (e.g., gate) of the replica input transistor M5$_R$ of the replica circuit 220 of the common mode voltage control circuit 210 for the CTLE 205.

The reason for this is that the control variation of the first replica common mode voltage VOCM1$_R$ may affect the control operation of the common mode voltage control circuit 210. As the first target common mode voltage VOCM1$_T$ is substantially constant (and is substantially the same as the first replica common mode voltage VOCM1$_R$), it will not adversely affect the control operation of the common mode voltage control circuit 210.

Figure 5:
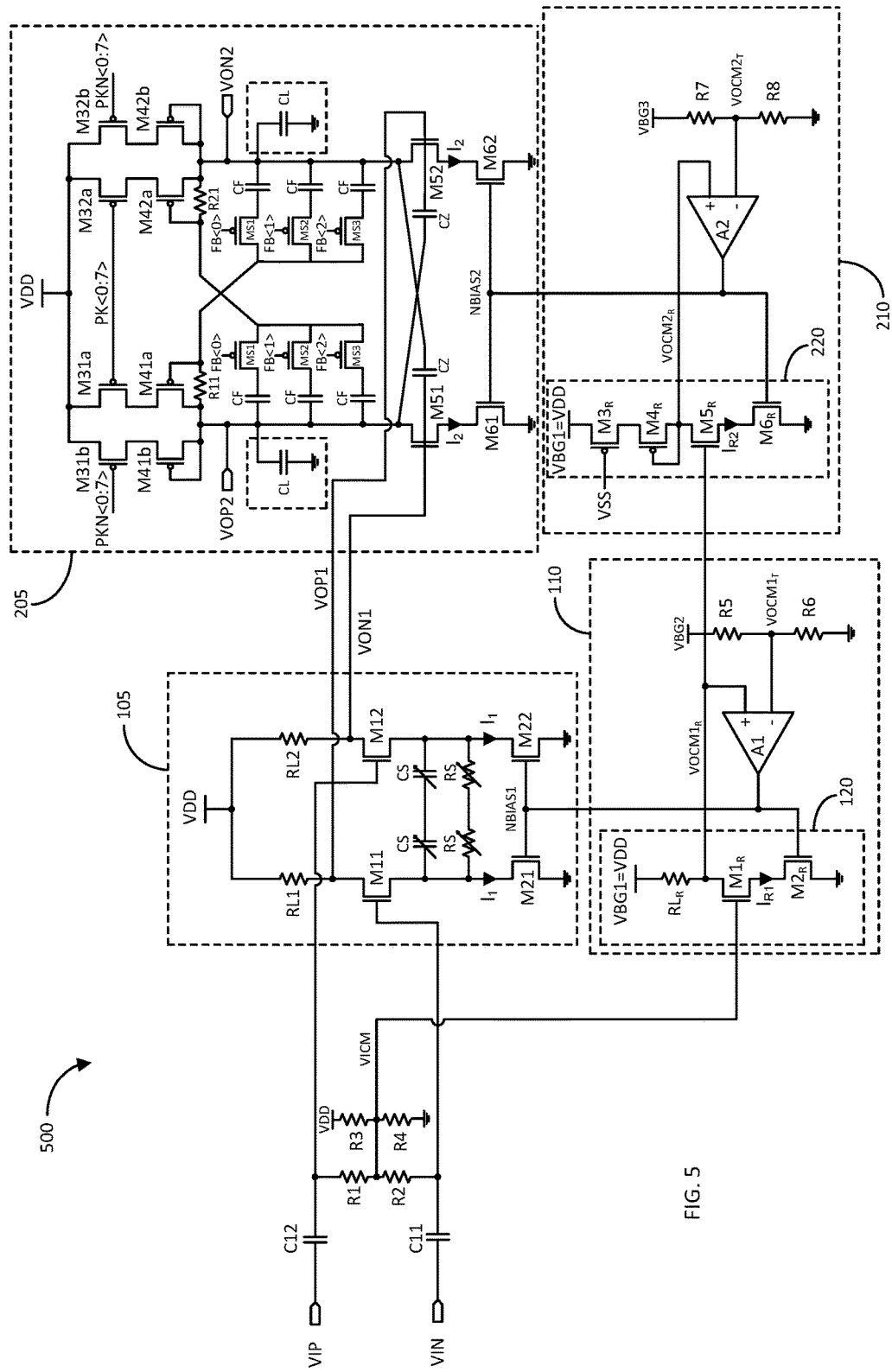
FIG. 5 illustrates a schematic diagram of another exemplary receiver including a VGA cascaded with a CTLE in accordance with another aspect of the disclosure.

FIG. 5 illustrates a block diagram of yet another exemplary receiver 500 including the VGA 105 cascaded with the CTLE 205 in accordance with another aspect of the disclosure. The receiver 500 is also a variation of receiver 300. A difference between receiver 500 and receiver 300 is that the supply voltages for the VGA replica circuit 120, the VGA voltage divider R5/R6, the CTLE replica circuit 220, and the CTLE voltage divider R7/R8 are "cleaner" (less noisy) bandgap reference voltages. This may improve the power supply noise rejection for the VGA 105 and the CTLE 205.

In particular, bandgap reference voltage VBG1 for the VGA replica circuit 120 and the CTLE replica circuit 220 should be at substantially the same potential as VDD so that the replica circuits receive the same supply voltage level as the VGA 105 and CTLE 205, respectively. The bandgap reference voltages VBG2 and VBG3 for the voltage dividers R5/R6 and R7/R8 could be substantially the same or different than the same potential as VDD.

Figure 6:
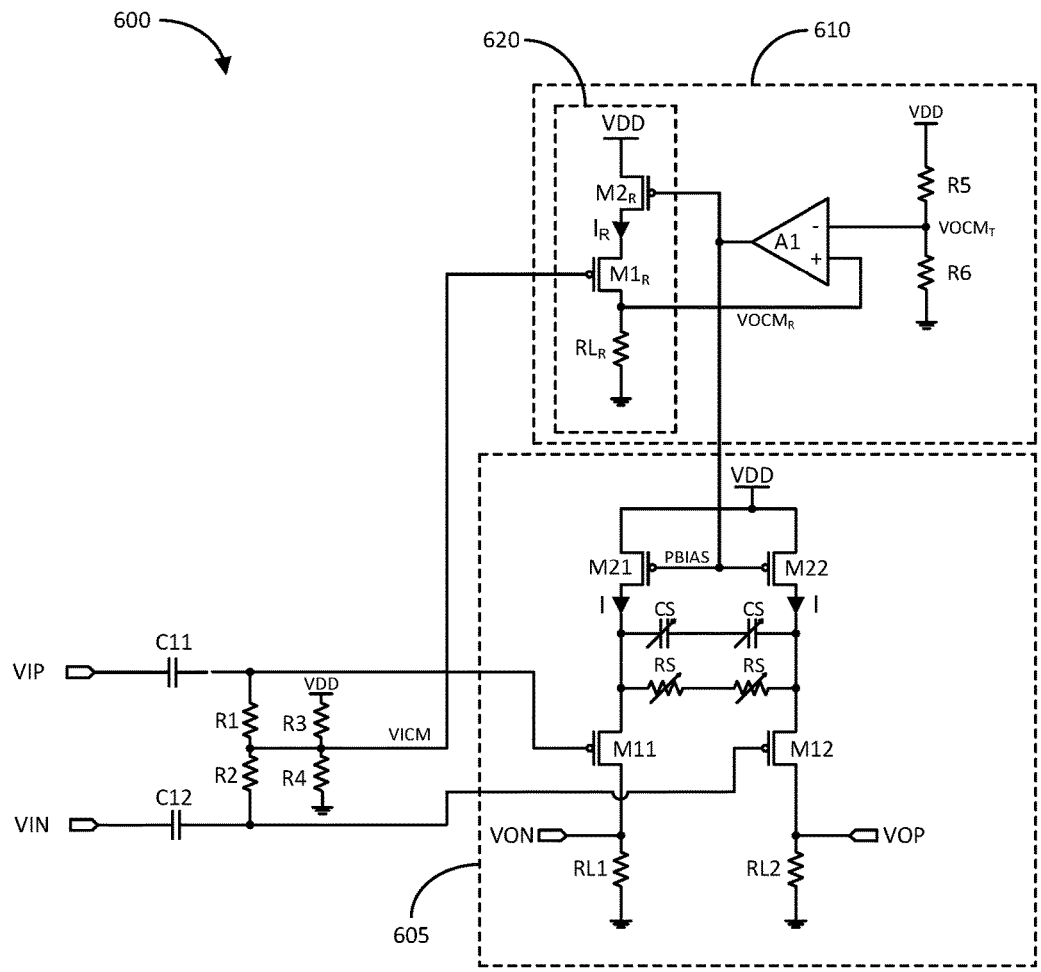
FIG. 6 illustrates a schematic diagram of another exemplary receiver including a VGA with a common mode voltage control circuit in accordance with another aspect of the disclosure.

FIG. 6 illustrates a receiver 600 including a "p-version" of a VGA 605 and a common mode voltage control circuit 610 for setting (e.g., controlling or regulating) the common mode voltage VOCM of an output differential signal VOP and VON of the VGA 605. The VGA 605 is a p-version because it includes PMOS as input transistors and current-source transistors, and it is flipped up-side-down as compared to the "n-version" VGA 105 previously discussed.

In particular, the VGA 605 includes current-source transistors (e.g., PMOSs) M21 and M22, input transistors (e.g., PMOSs) M11 and M12, and load devices (e.g., resistors) RL1 and RL2 coupled in series in that order between the first voltage rail (VDD) and the second voltage rail (VSS) (e.g., ground), respectively. The VGA 605 similarly includes one or more variable capacitors CS and one or more variable resistors RS coupled in parallel between the upper terminals (e.g., sources) of the input transistors M11 and M12. The positive component VIP and negative component VIN of the input differential signal are applied to the control terminals (e.g., gates) of the transistors M11 and M12 via AC-coupling capacitors C11 and C12, respectively. The positive component VOP and negative component VON of the output differential signal are generated at the lower terminals (e.g., drains) of the input transistors M12 and M11, respectively.

The common mode voltage control circuit 610 includes a replica circuit 620 that replicates one side of the VGA 605. That is, the replica circuit 620 includes a replica current-source transistor M2$_R$ (e.g., PMOS), a replica input transistor M1$_R$ (e.g., PMOS), and a replica load device RL$_R$ (e.g., resistor) coupled in series between the first voltage rail (VDD) and the second voltage rail (VSS). The common mode voltage VICM of the input differential signal, generated at the intermediate node of resistor network R1/R2 and R3/R4, is applied to the control terminal (e.g., gate) of the replica input transistor M1$_R$.

The common mode voltage circuit 610 further includes a differential (operational) amplifier A1 configured to generate a bias voltage PBIAS applied to the control terminal (e.g., gate) of the replica current-source transistor M2$_R$, and to the control terminals (e.g., gates) of the current-source transistors M21 and M22 of the VGA 605. Through feedback control, the differential amplifier A1 generates the bias voltage PBIAS to cause a replica common mode voltage VOCM$_R$ at the lower terminal (e.g., drain) of replica input transistor M1R to be substantially the same as a target common mode voltage VOCM$_T$ generated by a divider R5/R6. Accordingly, the common mode voltage control circuit 610 operates similar to control circuit 110 to generate a bias voltage PBIAS for the control terminals (e.g., gates) of the current-source transistors M21 and M22 (e.g., PMOSs) to set (e.g., control or regulate) the common mode voltage VOCM of the output differential signal VOP and VON to the target common mode voltage VOCM$_T$.

Figure 7:
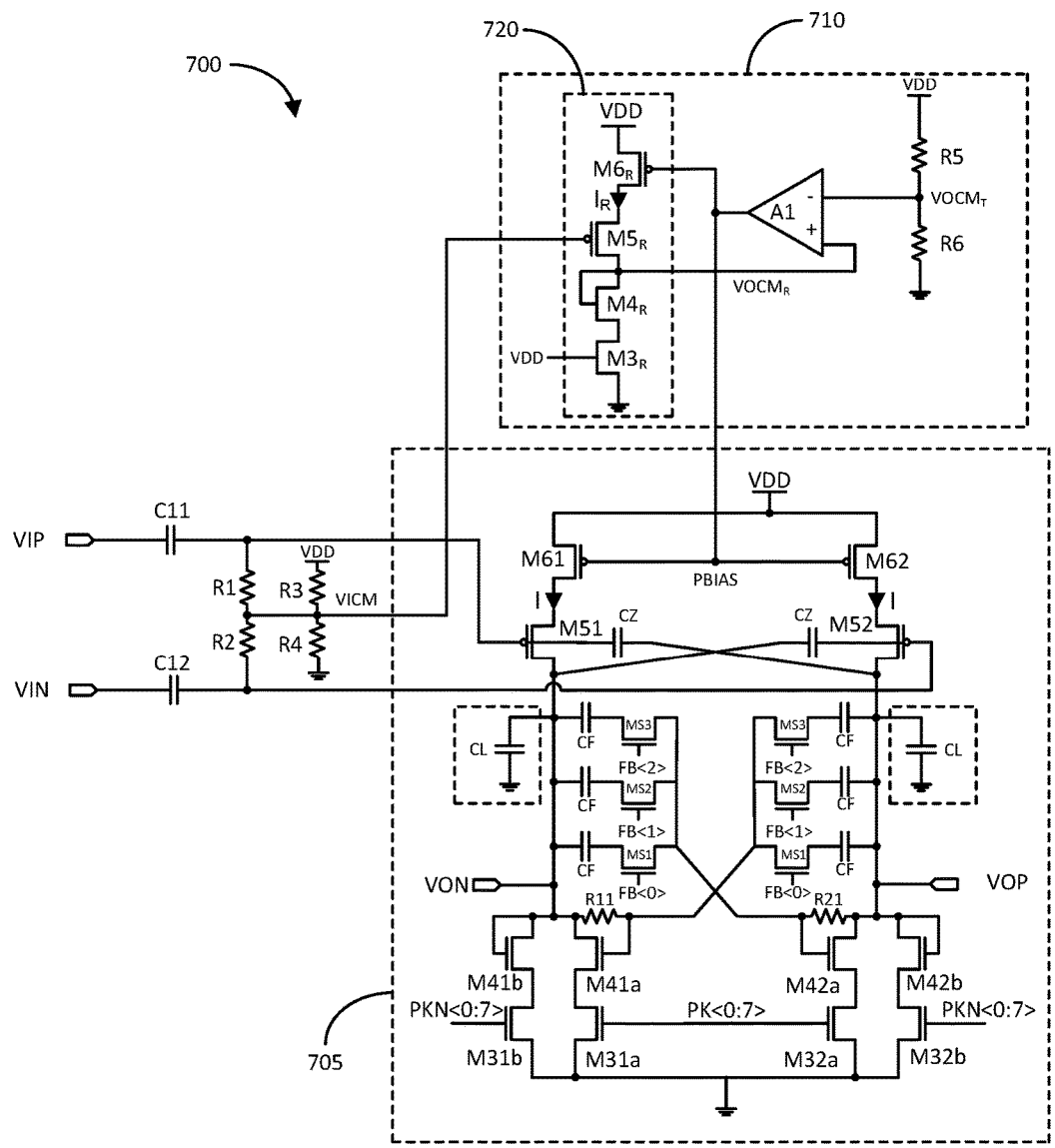
FIG. 7 illustrates a schematic diagram of another exemplary receiver including a CTLE with a common mode voltage control circuit in accordance with another aspect of the disclosure.

FIG. 7 illustrates a receiver 700 including a "p-version" of a CTLE 605 and a common mode voltage control circuit 710 for setting (e.g., controlling or regulating) the common mode voltage VOCM of an output differential signal VOP and VON of the CTLE 705. The CTLE 705 is a p-version because it includes PMOS as input transistors and current-source transistors, and it is flipped up-side-down as compared to the "n-version" CTLE 205 previously discussed.

In particular, the CTLE 705 includes current-source transistors (e.g., PMOSs) M61 and M62, input transistors (e.g., PMOSs) M51 and M52, and positive- and negative-side sets of parallel load (diode-connected) transistors (e.g., NMOS), collectively referred to as M41a-M41b and M42a-M42b, and two sets of load-selecting switch devices (e.g., NMOSs) via select signals PKN<0:7>, collectively referred to as M31a-b and M32a-b, coupled in series in that order between the first voltage rail (VDD) and the second voltage rail (VSS) (e.g., ground), respectively. The CTLE 705 similarly includes positive- and negative-side sets of selectable capacitor paths (MS1+CF∥MS2+CF∥MS3+CF) coupled in parallel between the lower terminals (e.g., drains) of the input transistors M51 and M52 and resistors R21 and R11, respectively. For impedance matching and noise reduction, the CTLE 705 includes cross-coupled capacitors CZ coupled between the control terminals (e.g, gates) and lower terminals (e.g., drains) of input transistors M51 and M52, respectively.

The positive component VIP and negative component VIN of the input differential signal are applied to the control terminals (e.g., gates) of the transistors M51 and M52 via AC-coupling capacitors C11 and C12, respectively. The positive component VOP and negative component VON of the output differential signal are generated at the lower terminals (e.g., drains) of the input transistors M52 and M51, respectively.

The common mode voltage control circuit 710 includes a replica circuit 720 that replicates one side of the CTLE 705. That is, the replica circuit 720 includes a replica current-source transistor $M6_R$ (e.g., PMOS), a replica input transistor $M5_R$ (e.g., PMOS), a replica load (diode-connected) transistor $M4_R$ (e.g., NMOS), and a replica switch device $M3_R$ (e.g., NMOS) coupled in series between the first voltage rail (VDD) and the second voltage rail (VSS) (e.g., ground). The common mode voltage VICM of the input differential signal, generated at the intermediate node of resistor network R1/R2 and R3/R4, is applied to the control terminal (e.g., gate) of the replica input transistor $M5_R$. The voltage VDD is applied to the control terminal (e.g., gate) of the replica switch device $M3_R$.

The common mode voltage circuit 710 further includes a differential (operational) amplifier A1 configured to generate a bias voltage PBIAS applied to the control terminal (e.g., gate) of the replica current-source transistor $M6_R$, and to the control terminals (e.g., gates) of the current-source transistors M61 and M62 of the CTLE 705. Through feedback control, the differential amplifier A1 generates the bias voltage PBIAS to cause a replica common mode voltage $VOCM_R$ at the lower terminal (e.g., drain) of replica input transistor M5R to be substantially the same as a target common mode voltage $VOCM_T$ generated by a divider R5/R6. Accordingly, the common mode voltage control circuit 710 operates similar to control circuit 210 to generate a bias voltage PBIAS for the control terminals (e.g., gates) of the current-source transistors M61 and M62 (e.g., PMOSs) to set (e.g., control or regulate) the common mode voltage VOCM of the output differential signal VOP and VON to the target common mode voltage $VOCM_T$.

Figure 8:
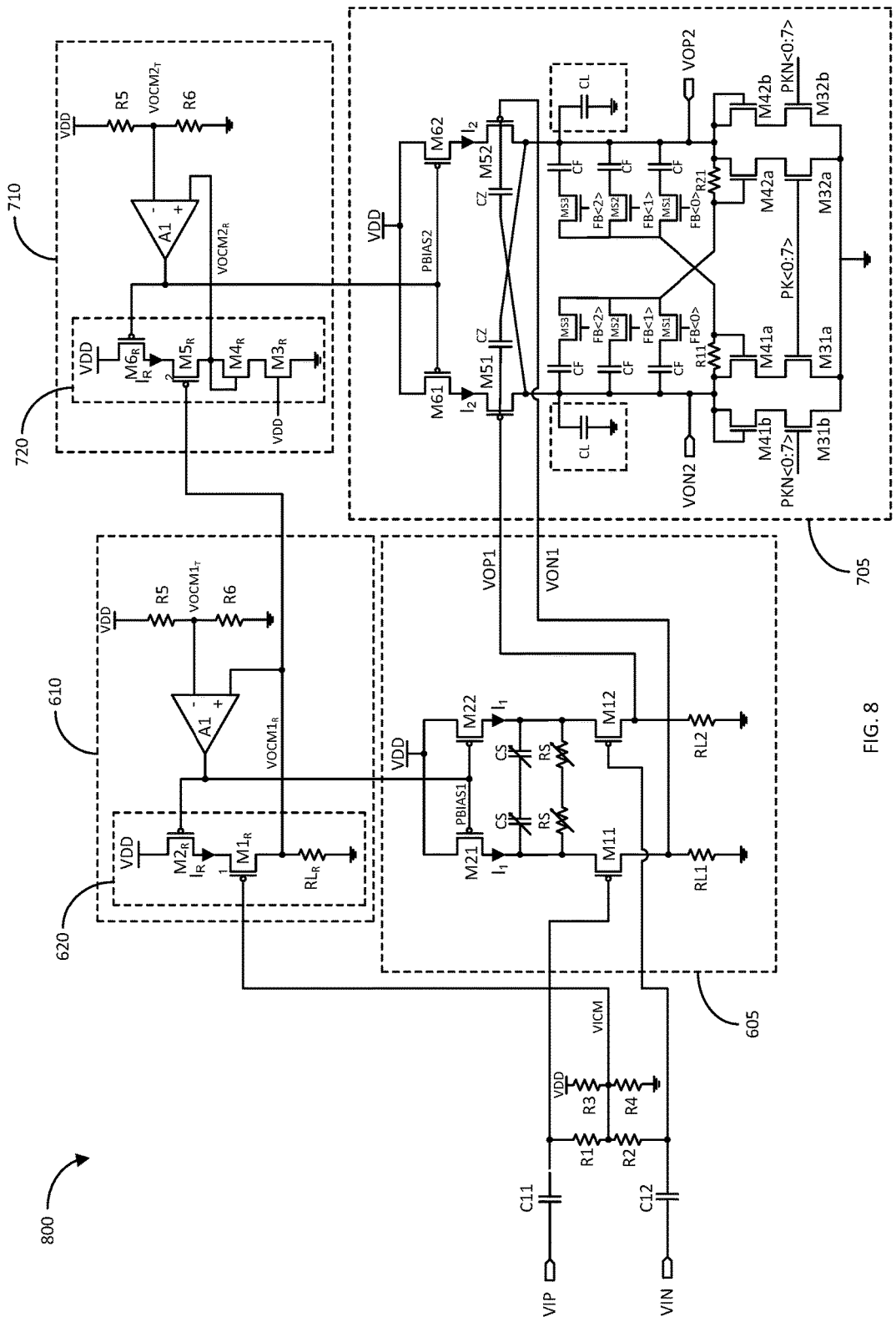
FIG. 8 illustrates a schematic diagram of another exemplary receiver including a VGA cascaded with a CTLE in accordance with another aspect of the disclosure.

FIG. 8 illustrates a schematic diagram of another exemplary receiver 800 including a VGA 605 cascaded with the CTLE 705 in accordance with another aspect of the disclosure. The receiver 800 is similar to receiver 300 with the exception that it employs the p-version VGA 605 and corresponding common mode control circuit 610, and the p-version CTLE 705 and corresponding common mode control circuit 710.

In summary, the VGA control circuit 610 generates a first bias voltage PBIAS1 to set and control the common mode voltage VOCM1 of a first output differential signal VOP1 and VON1 generated by the VGA 605 based on the common mode voltage VICM of the input differential signal VIP and VIN, a first replica output common mode voltage $VOCM1_R$, and a first target common mode voltage $VOCM1_T$, as previously discussed. Similarly, the control circuit 710 generates a second bias voltage PBIAS2 to set and control the common mode voltage VOCM2 of a second output differential signal VOP2 and VON2 generated by the CTLE 705 based on the first replica common mode voltage $VOCM1_R$ generated by the control circuit 610, a second replica output common mode voltage $VOCM2_R$, and a second target common mode voltage $VOCM2_T$, as previously discussed.

Figure 9:
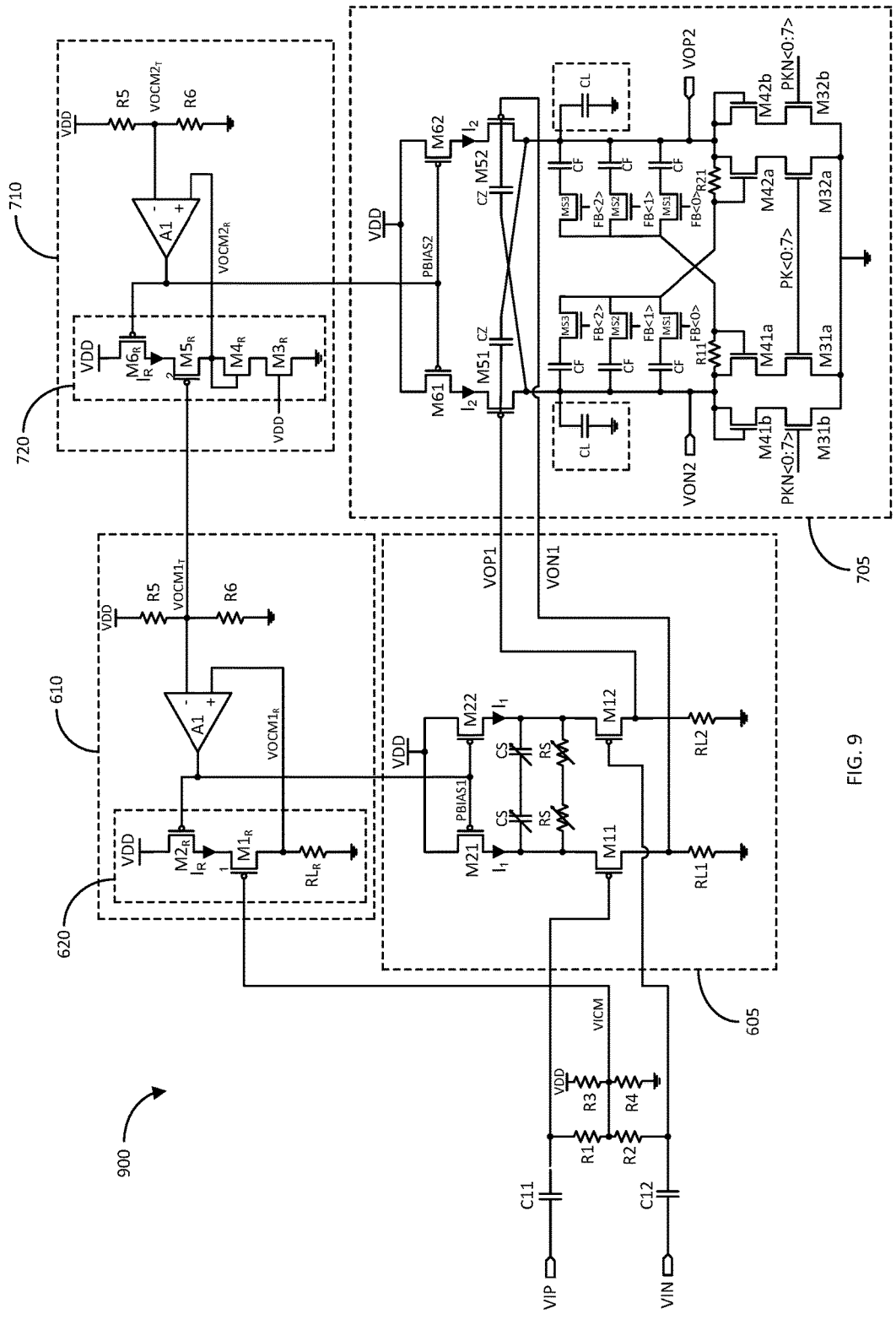
FIG. 9 illustrates a schematic diagram of another exemplary receiver including a VGA cascaded with a CTLE in accordance with another aspect of the disclosure.

FIG. 9 illustrates a schematic diagram of another exemplary receiver 900 including a VGA 605 cascaded with the CTLE 705 in accordance with another aspect of the disclosure. The receiver 900 is a variation of receiver 800. A difference between receiver 900 and receiver 800 is that the first target common mode voltage $VOCM1_T$ (and not the first replica common mode voltage $VOCM1_R$) is applied to the control input (e.g., gate) of the replica input transistor $M5_R$ of the replica circuit 720 of the common mode voltage control circuit 710 for the CTLE 705.

Again, the reason for this is that the control variation of the first replica common mode voltage $VOCM1_R$ may affect the control operation of the common mode voltage control circuit 710. As the first target common mode voltage $VOCM1_T$ is substantially constant (and is substantially the same as the first replica common mode voltage $VOCM1_R$), it should not adversely affect the control operation of the common mode voltage control circuit 710.

Figure 10:
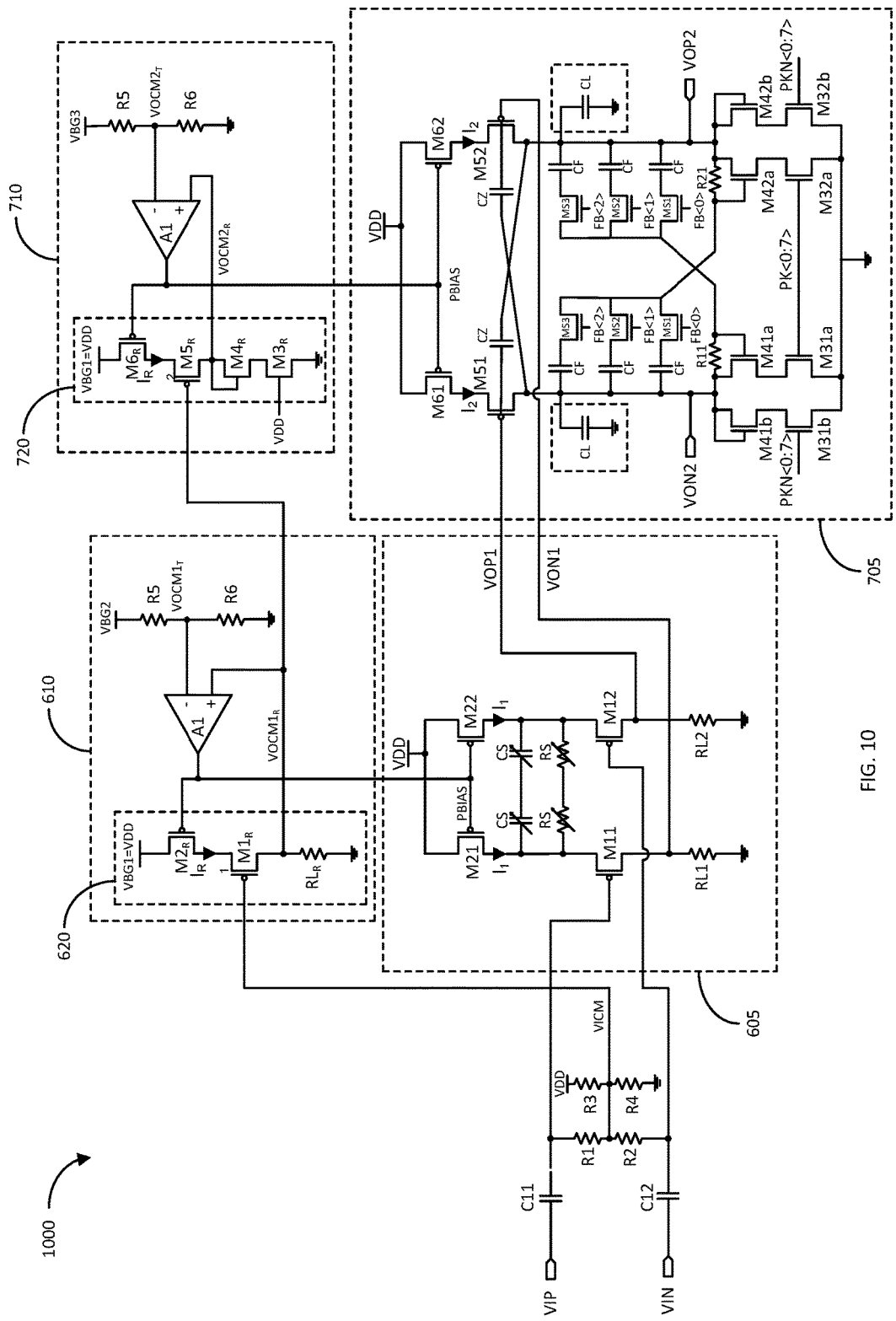
FIG. 10 illustrates a schematic diagram of another exemplary receiver including a VGA cascaded with a CTLE in accordance with another aspect of the disclosure.

FIG. 10 illustrates a schematic diagram of another exemplary receiver 1000 including the VGA 605 cascaded with the CTLE 705 in accordance with another aspect of the disclosure. The receiver 1000 is a variation of receiver 800. A difference between receiver 1000 and receiver 800 is that the supply voltages for the VGA replica circuit 620, the VGA voltage divider R5/R6, the CTLE replica circuit 720, and the CTLE voltage divider R7/R8 are "cleaner" (less noisy) bandgap reference voltages. This may improve the power supply noise rejection for the VGA 605 and the CTLE 705.

In particular, bandgap reference voltage VBG1 for the VGA replica circuit 620 and the CTLE replica circuit 720 should be at substantially the same potential as VDD so that the replica circuits receive the same supply voltage level as the VGA 605 and CTLE 705, respectively. The bandgap reference voltages VBG2 and VBG3 for the voltage dividers R5/R6 and R7/R8 could be substantially the same as or different than VDD.

Figure 11:
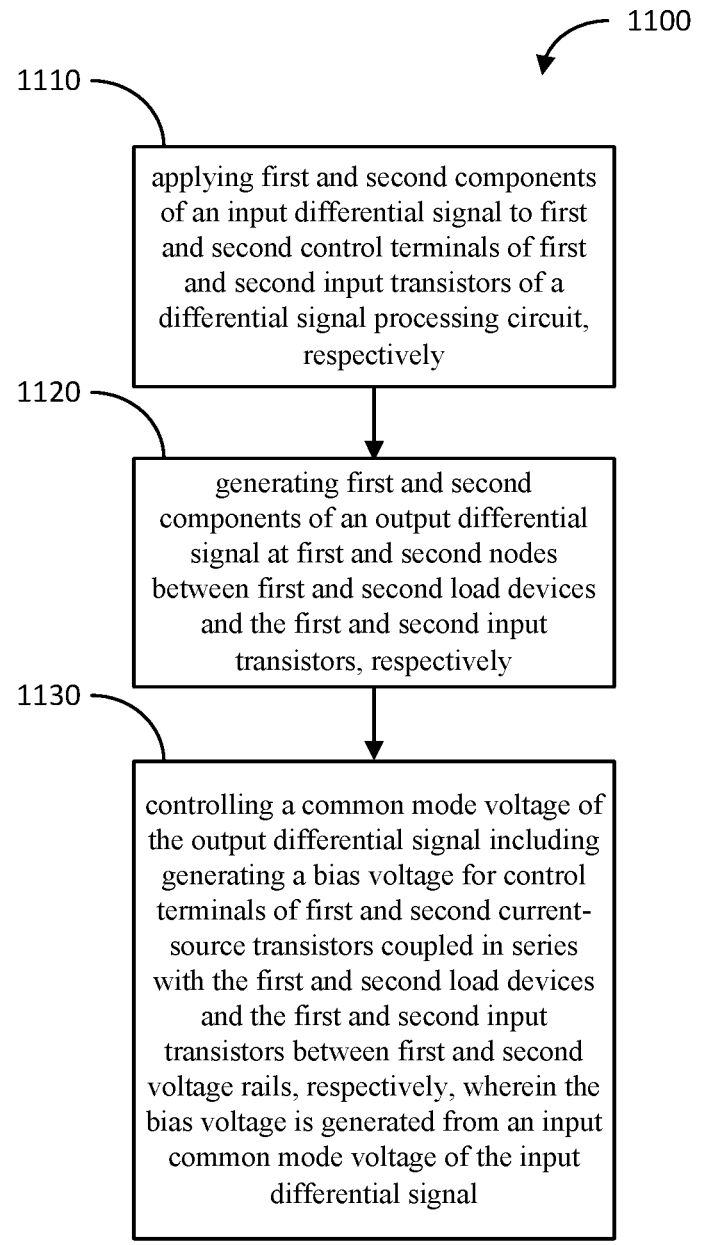
FIG. 11 illustrates a flow diagram of an exemplary method of controlling a common mode voltage of an output signal of a differential signal processing circuit in accordance with another aspect of the disclosure.

FIG. 11 illustrates a flow diagram of an exemplary method 1100 of controlling a common mode voltage of an output differential signal of a differential signal processing circuit in accordance with another aspect of the disclosure.

The method 1100 includes applying first and second components of an input differential signal to first and second control terminals of first and second input transistors of a differential signal processing circuit, respectively (block 1110). As illustrated in the various receivers described herein, the circuit including the AC-coupling capacitors C11 and C12 configured to apply the differential input signal VIP and VIN to the input transistors of the various differential signal processing circuits described herein is an example of a means for applying first and second components of an input differential signal at first and second control terminals of first and second input transistors of a differential signal processing circuit, respectively.

The method 1100 further includes generating first and second components of an output differential signal at first and second nodes between first and second load devices and the first and second input transistors, respectively (block 1120). As illustrated in the various receivers described herein, the various differential signal processing circuits including the variable gain amplifiers (VGAs) 105 and 605 and the continuous time linear equalizers (CTLEs) 205 and 705 are examples of means for generating first and second components of an output differential signal at first and second nodes between first and second load devices and the first and second input transistors, respectively.

The method 1100 further includes controlling a common mode voltage of the output differential signal including generating a bias voltage for control terminals of first and second current-source transistors coupled in series with the first and second load devices and the first and second input transistors between first and second voltage rails, respectively, wherein the bias voltage is generated from an input common mode voltage of the input differential signal (block 1130). As illustrated in the various receivers described herein, the various common mode control circuits 110, 210, 610, and 710 are examples of means for controlling a common mode voltage of the output differential signal including generating a bias voltage for control terminals of first and second current-source transistors coupled in series with the first and second load devices and the first and second input transistors between first and second voltage rails, respectively, wherein the bias voltage is generated from an input common mode voltage of the input differential signal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   a first differential signal processing circuit configured to generate a first output differential signal based on an input differential signal, comprising:
   first and second load devices;
   first and second input transistors including first and second control terminals configured to receive first and second components of the input differential signal, respectively; and
   first and second current-source transistors coupled in series with the first and second load devices and the first and second input transistors between a first voltage rail and a second voltage rail, respectively;
   wherein first and second components of the first output differential signal are configured to be generated at first and second nodes between the first and second load devices and the first and second input transistors, respectively; and
   a first control circuit configured to control a first output common mode voltage of the first output differential signal by generating a first bias voltage for control terminals of the first and second current-source transistors from an input common mode voltage of the input differential signal.

2. The apparatus of claim 1, wherein the first control circuit comprises:
   a first replica load device;
   a first replica input transistor including a first replica control terminal configured to receive the input common mode voltage of the input differential signal, wherein a first replica output common mode voltage is configured to be generated at a first replica node between the first replica load device and the first replica input transistor; and
   a first replica current-source transistor coupled in series with the first replica load device and the first replica input transistor between the first voltage rail and the second voltage rail, wherein the first bias voltage is based on the first replica output common mode voltage, and wherein the first bias voltage is configured to be applied to a control terminal of the first replica current-source transistor.

3. The apparatus of claim 2, wherein the first control circuit further comprises a first differential amplifier configured to generate the first bias voltage based on the first replica output common mode voltage and a first target output common mode voltage applied to respective inputs of the first differential amplifier.

4. The apparatus of claim 3, wherein the first control circuit further comprises a voltage divider coupled between the first voltage rail and the second voltage rail, wherein the voltage divider is configured to generate the first target output common mode voltage.

5. The apparatus of claim 3, wherein the first control circuit further comprises a voltage divider coupled between a third voltage rail and the second voltage rail, wherein the third voltage rail is configured to receive a bandgap reference voltage, and wherein the voltage divider is configured to generate the first target output common mode voltage.

6. The apparatus of claim 3, further comprising:
   a second differential signal processing circuit configured to generate a second output differential signal based on the first output differential signal, comprising:
   third and fourth load devices;
   third and fourth input transistors including third and fourth control terminals configured to receive the first and second components of the first output differential signal, respectively; and
   third and fourth current-source transistors coupled in series with the third and fourth load devices and the third and fourth input transistors between the first voltage rail and the second voltage rail, respectively;
   wherein first and second components of the second output differential signal are configured to be generated at third and fourth nodes between the third and fourth load devices and the third and fourth input transistors, respectively;
   a second control circuit configured to control a second output common mode voltage of the second output differential signal by generating a second bias voltage for control terminals of the third and fourth current-source transistors from the first replica output common mode voltage or the first target output common mode voltage.

7. The apparatus of claim 6, wherein the second control circuit comprises:
   a second replica load device;
   a second replica input transistor including a second replica control terminal configured to receive the first replica output common mode voltage or the first target output common mode voltage, wherein a second replica output common mode voltage is configured to be generated at a second replica node between the second replica load device and the second replica input transistor; and
   a second replica current-source transistor coupled in series with the second replica load device and the second replica input transistor between the first voltage rail and the second voltage rail, wherein the second bias voltage is based on the second replica output common mode voltage, and wherein the second bias voltage is configured to be applied to a control terminal of the second replica current-source transistor.

8. The apparatus of claim 7, wherein the second control circuit further comprises a second differential amplifier configured to generate the second bias voltage based on the second replica output common mode voltage and a second target output common mode voltage applied to respective inputs of the second differential amplifier.

9. The apparatus of claim 8, wherein the second control circuit further comprises a voltage divider coupled between the first voltage rail and the second voltage rail, wherein the voltage divider is configured to generate the second target output common mode voltage.

10. The apparatus of claim 8, wherein the second control circuit further comprises a voltage divider coupled between a third voltage rail and the second voltage rail, wherein the third voltage rail is configured to receive a bandgap reference voltage, and wherein the voltage divider is configured to generate the second target output common mode voltage.

11. The apparatus of claim 6, wherein the second control circuit comprises:
a second replica load device;
a second replica input transistor including a second replica control terminal configured to receive the first replica output common mode voltage or the first target output common mode voltage, wherein a second replica output common mode voltage is configured to be generated at a third replica node between the second replica load device and the second replica input transistor; and
a second replica current-source transistor coupled in series with the second replica load device and the second replica input transistor between a third voltage rail and the second voltage rail, wherein the third voltage rail is configured to receive a bandgap reference voltage, wherein the second bias voltage is based on the second replica output common mode voltage, and wherein the second bias voltage is configured to be applied to a control terminal of the second replica current-source transistor.

12. The apparatus of claim 6, wherein the second differential signal processing circuit comprises a continuous time linear equalizer (CTLE).

13. The apparatus of claim 12, wherein the first differential signal processing circuit comprises a variable gain amplifier (VGA).

14. The apparatus of claim 1, wherein the first differential processing circuit comprises a variable gain amplifier (VGA).

15. The apparatus of claim 1, wherein the first control circuit comprises:
a first replica load device;
a first replica input transistor including a first replica control terminal configured to receive the input common mode voltage of the input differential signal, wherein a first replica output common mode voltage is configured to be generated at a replica node between the first replica load device and the first replica input transistor; and
a first replica current-source transistor coupled in series with the first replica load device and the first replica input transistor between a third voltage rail and the second voltage rail, wherein the third voltage rail is configured to receive a bandgap reference voltage, wherein the first bias voltage is based on the first replica output common mode voltage, and wherein the first bias voltage is configured to be applied to a control terminal of the first replica current-source transistor.

16. A method, comprising:
applying first and second components of an input differential signal to first and second control terminals of first and second input transistors of a first differential signal processing circuit, respectively;
generating first and second components of a first output differential signal at first and second nodes between first and second load devices and the first and second input transistors, respectively; and
controlling a first common mode voltage of the first output differential signal, including generating a first bias voltage for control terminals of first and second current-source transistors coupled in series with the first and second load devices and the first and second input transistors between first and second voltage rails, respectively, wherein the first bias voltage is generated from an input common mode voltage of the input differential signal.

17. The method of claim 16, further comprising:
applying the input common mode voltage to a control terminal of a first replica input transistor;
generating a first replica output common mode voltage at a first replica node between a first replica load device and the first replica input transistor; and
applying the first bias voltage to a first replica current-source transistor coupled in series with the first replica load device and the first replica input transistor between the first voltage rail or a third voltage rail and the second voltage rail, wherein the third voltage rail is configured to receive a bandgap reference voltage.

18. The method of claim 17, wherein generating the first bias voltage comprises generating the first bias voltage based on the first replica output common mode voltage and a first target output common mode voltage.

19. The method of claim 18, further comprising generating the first target output common mode voltage based on a voltage at the first voltage rail or a bandgap reference voltage.

20. The method of claim 18, further comprising:
applying the first and second components of the first output differential signal to third and fourth control terminals of third and fourth input transistors of a second differential signal processing circuit, respectively;
generating first and second components of a second output differential signal at third and fourth nodes between third and fourth load devices and the third and fourth input transistors, respectively; and
controlling a second common mode voltage of the second output differential signal including generating a second bias voltage for control terminals of third and fourth current-source transistors coupled in series with the third and fourth load devices and the third and fourth input transistors between the first and second voltage rails, respectively, wherein the second bias voltage is generated from the first replica output common mode voltage or the first target output common mode voltage.

21. The method of claim 20, further comprising:
applying the first replica output common mode voltage or the first target output common mode voltage to a control terminal of a second replica input transistor;
generating a second replica output common mode voltage at a second replica node between a second replica load device and the second replica input transistor; and applying the second bias voltage to a second replica current-source transistor coupled in series with the first replica load device and the first replica input transistor between the first voltage rail or the third voltage rail and the second voltage rail.

22. The method of claim 21, wherein generating the second bias voltage comprises generating the second bias voltage based on the second replica output common mode voltage and a second target output common mode voltage.

23. The method of claim 22, further comprising generating the second output common mode voltage based on a voltage at the first voltage rail or a bandgap reference voltage.

24. An apparatus, comprising:
  means for applying first and second components of an input differential signal to first and second control terminals of first and second input transistors of a first differential signal processing circuit, respectively;
  means for generating first and second components of a first output differential signal at first and second nodes between first and second load devices and the first and second input transistors, respectively; and
  means for controlling a first common mode voltage of the first output differential signal including generating a first bias voltage for control terminals of first and second current-source transistors coupled in series with the first and second load devices and the first and second input transistors between first and second voltage rails, respectively, wherein the first bias voltage is generated from an input common mode voltage of the input differential signal.

25. The apparatus of claim 24, further comprising:
  means for applying the input common mode voltage to a control terminal of a first replica input transistor;
  means for generating a first replica output common mode voltage at a first replica node between a first replica load device and the first replica input transistor; and
  means for applying the first bias voltage to a first replica current-source transistor coupled in series with the first replica load device and the first replica input transistor between the first voltage rail or a third voltage rail and the second voltage rail, wherein the third voltage rail is configured to receive a bandgap reference voltage.

26. The apparatus of claim 25, wherein the means for generating the first bias voltage comprises means for generating the first bias voltage based on the first replica output common mode voltage and a first target output common mode voltage.

27. The apparatus of claim 26, further comprising means for generating the first target output common mode voltage based on a voltage at the first voltage rail or a bandgap reference voltage.

28. The method of claim 26, further comprising:
  means for applying the first and second components of the first output differential signal to third and fourth control terminals of third and fourth input transistors of a second differential signal processing circuit, respectively;
  means for generating first and second components of a second output differential signal at third and fourth nodes between third and fourth load devices and the third and fourth input transistors, respectively; and
  means for controlling a second common mode voltage of the second output differential signal including generating a second bias voltage for control terminals of third and fourth current-source transistors coupled in series with the third and fourth load devices and the third and fourth input transistors between the first and second voltage rails, respectively, wherein the second bias voltage is generated from the first replica output common mode voltage or the first target output common mode voltage.

29. The apparatus of claim 28, further comprising:
  means for applying the first replica output common mode voltage or the first target output common mode voltage to a control terminal of a second replica input transistor;
  means for generating a second replica output common mode voltage at a second replica node between a second replica load device and the second replica input transistor; and
  means for applying the second bias voltage to a second replica current-source transistor coupled in series with the second replica load device and the second replica input transistor between the first voltage rail or the third voltage rail and the second voltage rail.

30. The apparatus of claim 29, wherein means for generating the second bias voltage comprises means for generating the second bias voltage based on the second replica output common mode voltage and a second target output common mode voltage.

* * * * *